(12) United States Patent
Jin et al.

(10) Patent No.: US 8,901,936 B2
(45) Date of Patent: Dec. 2, 2014

(54) ARRAY TEST DEVICE, METHOD FOR TESTING AN ORGANIC LIGHT EMITTING DISPLAY DEVICE, AND METHOD FOR MANUFACTURING THE ORGANIC LIGHT EMITTING DISPLAY DEVICE

(75) Inventors: Guang hai Jin, Yongin (KR); Jae-Beom Choi, Yongin (KR); Kwan-Wook Jung, Yongin (KR); June-Woo Lee, Yongin (KR); Hae-Yeon Lee, Yongin (KR); Jae-Hwan Oh, Yongin (KR); Seong-Jun Kim, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 202 days.

(21) Appl. No.: 13/570,378

(22) Filed: Aug. 9, 2012

(65) Prior Publication Data
US 2013/0241562 A1    Sep. 19, 2013

(30) Foreign Application Priority Data
Mar. 14, 2012 (KR) .................. 10-2012-0026173

(51) Int. Cl.
*G01R 31/00* (2006.01)

(52) U.S. Cl.
USPC ...... 324/501; 324/760.02; 324/658; 324/522; 324/414; 250/310; 250/396 R; 250/370.09

(58) Field of Classification Search
USPC .................... 324/501, 760.02, 658–661, 686, 324/522–523; 250/310, 251.1, 396 R, 250/370.09; 345/173, 174, 690, 77; 349/113, 118, 176, 132
See application file for complete search history.

(56) References Cited

U.S. PATENT DOCUMENTS

| | | | | |
|---|---|---|---|---|
| 5,982,190 | A * | 11/1999 | Toro-Lira | 324/754.22 |
| 6,696,687 | B1 * | 2/2004 | Tomisaki et al. | 250/370.09 |
| 7,012,585 | B2 * | 3/2006 | Agostinelli et al. | 345/76 |
| 7,212,024 | B2 * | 5/2007 | Iwasaki et al. | 324/759.03 |
| 8,199,074 | B2 * | 6/2012 | Wang et al. | 345/76 |
| 8,736,520 | B2 * | 5/2014 | Koyama et al. | 345/76 |
| 2002/0153491 | A1 * | 10/2002 | Sugawara et al. | 250/370.09 |
| 2006/0061380 | A1 * | 3/2006 | Toro-Lira | 324/770 |
| 2006/0145087 | A1 * | 7/2006 | Parker | 250/396 R |
| 2006/0208195 | A1 * | 9/2006 | Petrick et al. | 250/370.09 |
| 2009/0281754 | A1 * | 11/2009 | Takatori | 702/82 |
| 2011/0278465 | A1 * | 11/2011 | Jung | 250/370.09 |
| 2012/0018646 | A1 * | 1/2012 | Takahashi | 250/370.09 |

FOREIGN PATENT DOCUMENTS

| | | |
|---|---|---|
| KR | 10-2005-0113701 A | 12/2005 |
| KR | 10-2006-0017586 A | 2/2006 |
| KR | 10-2006-00116238 A | 11/2006 |

* cited by examiner

*Primary Examiner* — Tung X Nguyen
*Assistant Examiner* — Thang Le
(74) *Attorney, Agent, or Firm* — Lee & Morse, P.C.

(57) ABSTRACT

A method for testing an array for a pixel circuit of an organic light emitting diode display, which includes a first transistor that transmits a driving current corresponding to a data signal to an organic light emitting diode according to a scan signal and at least one capacitor, uses an array test device having a control device and a driver. The method includes performing a first irradiation of electron beams to an exposed portion of a first electrode of the at least one capacitor before manufacturing of the organic light emitting diode is completed, calibrating the control device of the array test device based on secondary electrons output by the at least one capacitor, performing a second irradiation of electron beams to an anode of the pixel circuit, and detecting whether the first transistor is normally operated based on an output amount of secondary electrons output by the anode.

6 Claims, 9 Drawing Sheets

ARRAY TEST DEVICE, METHOD FOR TESTING AN ORGANIC LIGHT EMITTING DISPLAY DEVICE, AND METHOD FOR MANUFACTURING THE ORGANIC LIGHT EMITTING DISPLAY DEVICE

CROSS-REFERENCE TO RELATED APPLICATION

Korean Patent Application No. 10-2012-0026173, filed on Mar. 14, 2012, in the Korean Intellectual Property Office, and entitled: "Array Test Device, Method For an Organic Light Emitting Display Device, and Method For Manufacturing the Organic Light Emitting Display Device," is incorporated by reference herein in its entirety.

BACKGROUND

An organic light emitting diode display may have a self-light emitting characteristic, e.g., based on an organic light emitting diode within the display. The organic light emitting diode display may not need a separate light source, and may have high quality characteristics such as low power consumption, high luminance, and high reaction speed. Also, the display may be applicable to a high-speed operational circuit since it has excellent carrier mobility.

SUMMARY

Embodiments may be realizing by providing a method for testing an array for a pixel circuit of an organic light emitting diode display that includes a first transistor for transmitting a driving current corresponding to a data signal to an organic light emitting diode (OLED) according to a scan signal and at least one capacitor by using an array test device including a control device and a driver, the method including firstly irradiating electron beams to an exposed portion of a first electrode of the at least one capacitor before the organic light emitting diode (OLED) is finished; calibrating the control device of the array test device based on secondary electrons output by the capacitor; secondarily irradiating electron beams to an anode of the pixel circuit; and detecting whether the first transistor is normally operated from an output amount of the secondary electrons output by the anode.

The firstly irradiating of electron beams may be performed for a capacitor of a predetermined pixel circuit from among a plurality of pixel circuits included in the pixel array substrate. The secondarily irradiating of electron beams may be performed for a plurality of pixel circuits included in the pixel array substrate.

The method may further include, before the firstly irradiating of electron beams, setting a voltage to be charged to the capacitor with a predetermined reference voltage by presetting a voltage supplied to at least one signal line for connecting the pixel circuit. The calibrating may include controlling the control device so that a detected voltage following the secondary electrons output by the capacitor may correspond to the reference voltage.

The detecting of whether the first transistor is normally operated may include comparing an input voltage applied to the anode in the secondary irradiation of electron beams and an output voltage that corresponds to an output amount of secondary electrons output by the anode, and determining a corresponding pixel to be an abnormal pixel by tracking an address of a pixel circuit digressing from a predetermined threshold range of the input voltage.

Embodiments may also be realizing by providing a device for testing an array of an organic light emitting diode display that includes an electron beam irradiator, a signal analyzer, a controller, and a calibrator for performing a calibration process when the first detected voltage and the charging voltage are found to digress from a predetermined threshold range and do not correspond with each other by the controller.

The electron beam irradiator may irradiate first electron beams to a capacitor of a selected pixel from a pixel array including a plurality of pixels including an anode, a driving transistor for transmitting a driving current that corresponds to a data signal to an organic light emitting diode (OLED) according to a scan signal, and at least one capacitor, and may irradiate second electron beams to respective anodes of the pixels.

The signal analyzer may detect a first output amount of the secondary electrons that are output corresponding to irradiation of the first electron beams, may detect a second output amount of the secondary electrons that are output corresponding to irradiation of the second electron beams, and may calculate a first detected voltage that corresponds to the first output amount and a second detected voltage that corresponds to the second output amount.

The controller may set a charging voltage charged into the capacitor and an irradiated amount of the first electron beam and the second electron beam, may compare the first detected voltage and the charging voltage, and may determine an operational state of the pixel array based on the second detected voltage.

The calibrator may perform a calibration process when the first detected voltage and the charging voltage are found to digress from a predetermined threshold range and do not correspond with each other by the controller.

The array test device may include an electron beam output means for irradiating the first electron beams and the second electron beams and an electron detecting means for detecting secondary electrons that are output corresponding to irradiation of the first electron beams and the second electron beams, and may further include a driver driven with a gap from the pixel array.

The controller may preset the voltage supplied to at least one signal line for connecting the plurality of pixels and setting the charging voltage of the capacitor to be a predetermined reference voltage.

The controller may compare the second detected voltage and the input voltage applied to an anode in irradiation of the second electron beams, and may track an address of a pixel circuit digressing from a predetermined threshold range of the input voltage to determine the corresponding pixel to be an abnormal pixel.

The pixel may further include a first transistor for transmitting the data signal to a gate electrode of the driving transistor according to the scan signal; a second transistor connected to the gate electrode and a drain electrode of the driving transistor and compensating a threshold voltage of the driving transistor according to a first control signal; a third transistor for transmitting the data signal to the gate electrode of the driving transistor according to the first control signal; a first capacitor for storing the data signal applied to the gate electrode of the driving transistor; a second capacitor for storing a compensating voltage for compensating the threshold voltage of the driving transistor; and a third capacitor for maintaining a gate electrode voltage of the third transistor.

The first electron beams may be irradiated to one of the first capacitor to the third capacitor. The pixel may further include a fourth transistor connected between the drain electrode of the first transistor and the gate electrode of the driving transistor, and may transmit the data signal transmitted by the first transistor to the gate electrode of the driving transistor according to the second control signal.

Embodiments may also be realizing by providing a method for manufacturing an organic light emitting diode display that includes forming a pixel array, which includes a plurality of pixels including an anode, a driving transistor for transmitting a driving current that corresponds to a data signal to an organic light emitting diode (OLED) according to a scan signal, and at least one capacitor; irradiating first electron beams to a capacitor of a pixel selected from among the pixel array; when a first detected voltage that corresponds to an output amount of a detected rechargeable battery and a reference charging voltage of the capacitor digress from a predetermined threshold range and do not correspond with each other, performing a calibration process until they correspond with each other; irradiating second electron beams to respective anodes of a plurality of pixels of the pixel array; comparing a second detected voltage that corresponds to the output amount of the detected rechargeable battery and an input voltage applied to the anode to determine an operation state of the pixel array; when it is determined to be an inferior product, repairing the pixel array; and when it is determined to be a normal product or its repair is finished, completing an organic light emitting diode (OLED) of a pixel included in the pixel array.

BRIEF DESCRIPTION OF THE DRAWINGS

Features will become apparent to those of ordinary skill in the art by describing in detail exemplary embodiments with reference to the attached drawings in which.

DETAILED DESCRIPTION

Figure 1:
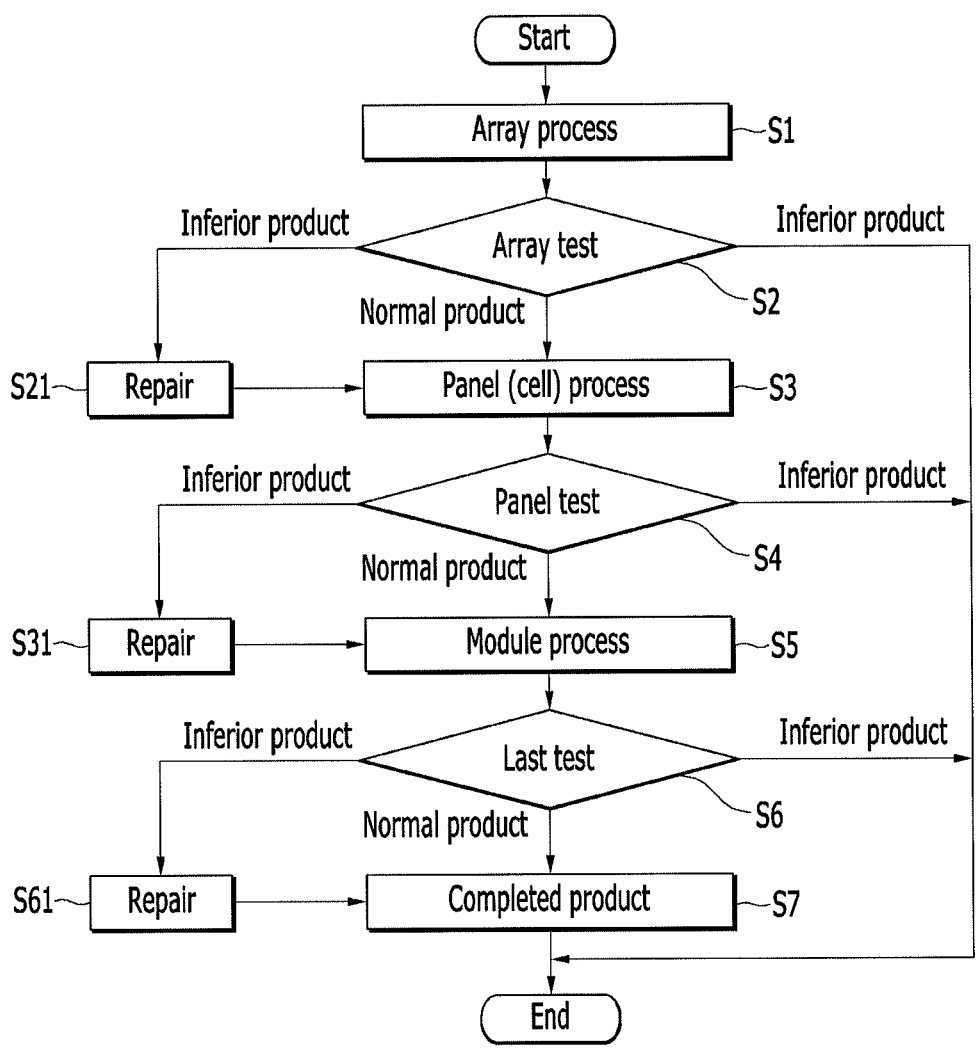
FIG. 1 illustrates a flowchart of a method for manufacturing an organic light emitting diode display according to an exemplary embodiment.

Embodiments will be described more fully hereinafter with reference to the accompanying drawings, in which exemplary embodiments are shown. As those skilled in the art would realize, the described embodiments may be modified in various different ways, all without departing from the spirit or scope of the present invention.

Parts that are irrelevant to the description are omitted in order to clearly describe the exemplary embodiments, and like reference numerals designate like elements throughout the specification.

Throughout this specification and the claims that follow, when it is described that an element is "coupled" to another element, the element may be "directly coupled" to the other element or "electrically coupled" to the other element through a third element. In addition, unless explicitly described to the contrary, the word "comprise" and variations such as "comprises" or "comprising" will be understood to imply the inclusion of stated elements but not the exclusion of any other elements.

FIG. 1 shows a flowchart of a method for manufacturing an organic light emitting diode display according to an exemplary embodiment.

An array process S1 for forming a pixel circuit array on a substrate is performed. The pixel circuit array includes a plurality of transistors and at least one capacitor, and the embodiment is not restricted thereto. However, a part of an electrode of the capacitor is formed to be exposed on the top side in the array process S1. An array test S2 is performed. In the array test S2, a normal operation state of the transistor is tested. A detailed process for the array test S2 will be described later with reference to FIG. 2.

A pixel array that is determined to be an inferior product in the array test S2 is repaired S21, or when it cannot be repaired, the test is finished. When the pixel array is determined to be a normal product or its repair is finished, an organic emission layer and a cathode are formed to manufacture the organic light emitting diode (OLED) (i.e., panel (cell) process S3), and a panel test S4 is then performed. In a like manner, the panel that is determined to be an inferior product in the panel test S4 finishes its repairing process S41, or when it cannot be repaired, the process is terminated. When the panel is determined to be a normal product or its repair is finished, it undergoes a module process S5 and a final test S6 is performed to determine a final product and an inferior product. The module that is determined to be an inferior product in the final test S6 undergoes a repair process S61 or manufacturing of it is terminated when it is determined to be inefficient and/or impossible to repair the inferior product. As known from FIG. 1, the operation trouble of the transistor may be tested after the array test S1 so the yield may be increased by preemptively repairing the trouble of the pixel circuit array. Further, the panel (cell) process and the module process are not performed for the troubled pixel circuit array that cannot be repaired so production time and costs may not be wasted.

A detailed method for an array test process S2 shown in FIG. 1 according to an exemplary embodiment will now be described.

Figure 2:
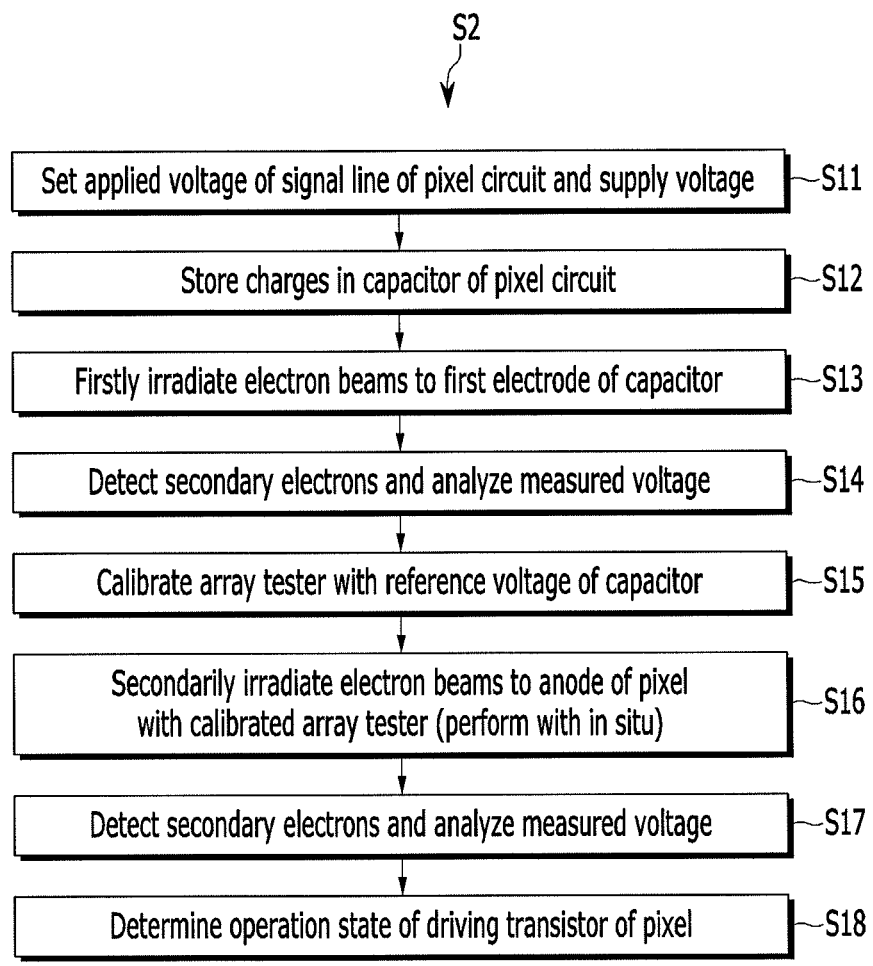
FIG. 2 illustrates a flowchart of an array test process shown in FIG. 1 according to an exemplary embodiment.

Referring to FIG. 2, a process S11 sets an applied voltage to a signal line of a pixel circuit in which the array process is finished, and supplies a corresponding voltage. The pixel circuit is not specifically restricted in the exemplary embodiment so the signal line connected to each pixel circuit can be various, and a level of a signal voltage applied to each signal line is preset and a corresponding voltage is applied. In this instance, the signal line includes a power supply line for supplying an external voltage.

Charges are stored in a predetermined capacitor included in the pixel circuit (S12). The predetermined capacitor is selected to store a predetermined voltage value before the array test so as to calibrate accuracy of the array test device from among a plurality of capacitors included in the pixel circuit. The selected capacitor may be changeable by a configuration of the pixel circuit.

A predetermined voltage is applied to the signal line in the above-noted process of S11 so the voltage stored in the selected capacitor may be anticipated. The voltage stored in the selected capacitor is variable by a connection structure between the circuit component and the signal line.

The capacitor is charged with the above voltage, and electron beams are irradiated to a first electrode of the capacitor (S13). A device for irradiating the electron beams can be included in the array test device.

Since the electron beams are irradiated to the first electrode of the capacitor after the pixel array is formed, the first electrode of the capacitor that is selected as a target to which the electron beams will be irradiated may be and/or must be partially exposed to the outside during the pixel array process.

Secondary electrons that are collided with and reflected from the first electrode of the capacitor after the electron beams are irradiated may be detected, and a detected amount of the secondary electrons are used to measure the voltage stored in the capacitor (S14).

The capacitor that is selected from the pixel circuit and has stored the charges in the process of S12 stores the voltage that is predictable, and the voltage at the capacitor that is actually measured can have a slight error value, contrary to the expectation depending on the process of the pixel array substrate, a characteristic of a material, or a gap between the modulator of the electron beam device and the array substrate. Therefore, a process (S15) for correcting the voltage value that is calculated from the secondary electrons that are detected after the electron beams are irradiated to the capacitor with a reference voltage is to be performed.

That is, when the predictable voltage to be charged in the predetermined capacitor and the calculated voltage that is measured through irradiation of electron beams are different, the predictable voltage is set to be the reference voltage and gradations of an array tester are controlled, thereby performing a calibration process.

A process (S16) for determining whether the array substrate of the pixel is normal in-situation (i.e., in situ) in the actual test process by using the calibrated array tester is performed. When the calibrated array tester has finished calibration of precise manipulation on the array substrate in the corresponding test process, the noise that may occur during the array test process of the display panel may be minimized.

When the pixel array substrate is passed over a conveyor belt during the test process, the electron beam device included in the calibrated array tester irradiates electron beams to an anode of the pixel circuit (S16). In this instance, the irradiation of electron beams represents a secondary test for testing a problem of the pixel array.

The secondary electrons that collide on the anode of the pixel circuit and reflected therefrom are detected, and they are used to measure the voltage at the anode of the pixel circuit (S17). The measured voltage at the anode of the pixel circuit becomes a reference to determine the problematic state of the transistor driven when the pixel is driven. Particularly, the operational state of the driving transistor for providing a driving current to the organic light emitting diode (OLED) of the pixel can be checked. That is, the operation state of the driving transistor of the pixel can be determined from the voltage that is measured by using the secondary electrons in the process of S17 (S18).

When the driving transistor of the pixel is not normally operated and generates a leakage current, the measured voltage may not have an original input value but another value in S17.

Figure 3:
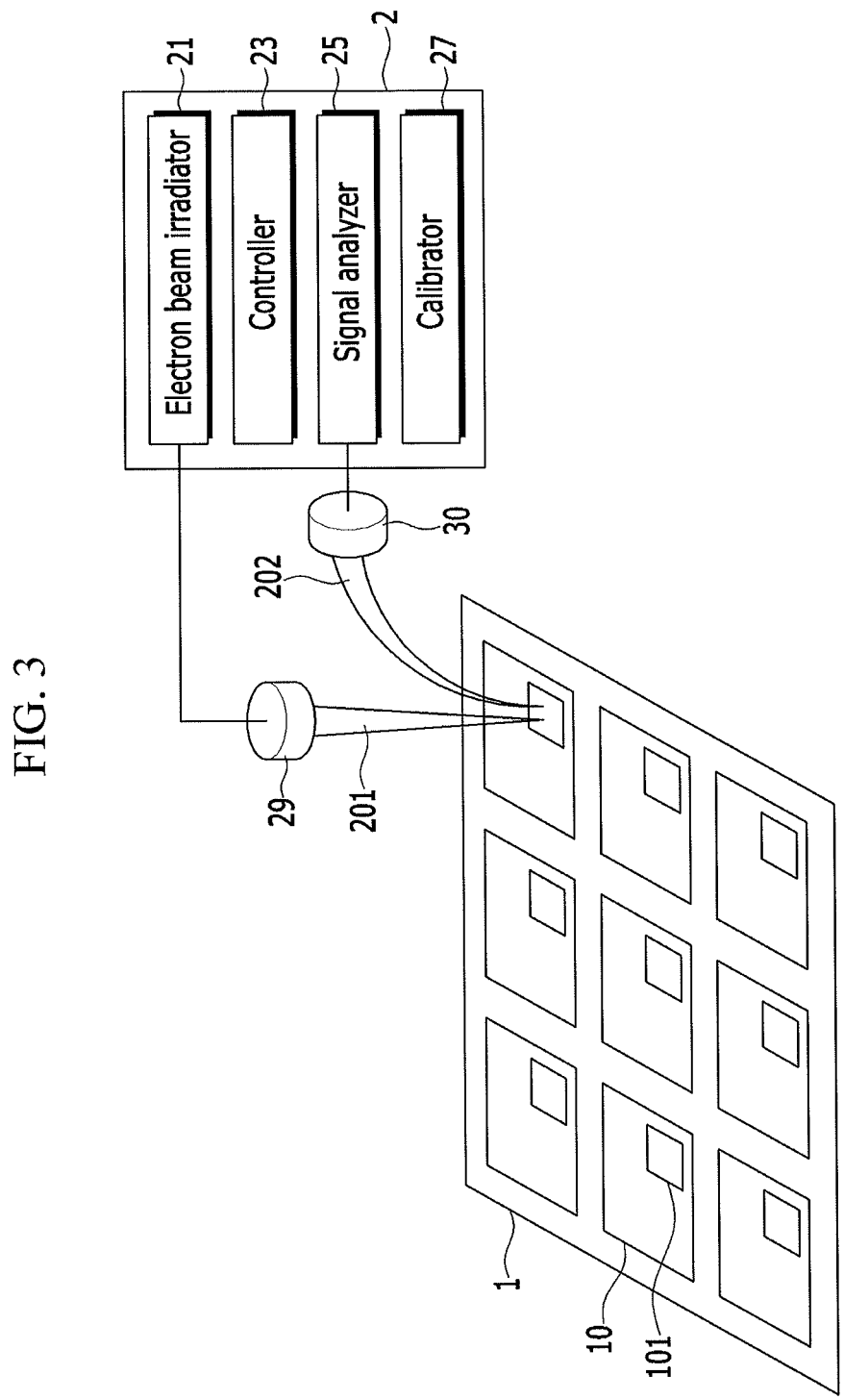
FIG. 3 illustrates a schematic diagram of an array test method according to an exemplary embodiment.

FIG. 3 shows a schematic diagram of an array test device for an array test method according to an exemplary embodiment.

Referring to FIG. 3, the array test device includes an electron beam emitting source 29 for irradiating an electron beam 201 to the array substrate 1, which is a test target, for a first time and a second time, and an electron detecting source 30 for receiving secondary electrons 202 of the electron beam reflected from the substrate. The array test device also includes a control device 2 for determining the first and second irradiation amounts of the electron beams, controlling precision through gradation control by using the secondary electrons of respective stages, and/or measuring the operation state of the transistor of the pixel circuit.

As shown in FIG. 3, illustrations of the first and second detections of the electron beam 201 irradiation and the secondary electrons 202 are not divided for convenience of description. Therefore, a contact hole 101 through which the electron beams are irradiated from a pixel unit 10 provided on the array substrate 1 can be a part of an electrode of the capacitor that is exposed outward or a part of the anode of the pixel.

In the exemplary embodiment of FIG. 3, the control device 2 includes an electron beam irradiator 21, a controller 23, a signal analyzer 25, and a calibrator 27.

The electron beam irradiator 21 irradiates the electron beams to the array substrate 1 by first and second stages in the array test method according to the exemplary embodiment. As described above, during the first irradiation period, the electron beam irradiator 21 irradiates the electron beams to an exposed part of the first electrode of the capacitor of the pixel through the electron beam emitting source 29 and the contact hole 101. Further, the pixel array substrate is substantially directly tested during the secondary irradiation period so the electron beam irradiator 21 irradiates the electron beam to the exposed part of the anode of the pixel through the electron beam emitting source 29 and the contact hole 101.

In this instance, the irradiated amount of the electron beams for the respective stages is determined by the controller 23. The irradiated amount of the electron beams that are irradiated by the electron beam irradiator 21 to the array substrate to calibrate the precision of the device the first time can be different from the irradiated amount of the electron beams that are irradiated the second time to determine the state of the pixel circuit of the array substrate.

The controller 23 controls a process for calibrating precision of the control device and/or controls a function of units that configure the control device in the array substrate test process.

That is, as described, the controller 23 determines the first or second irradiated amount of the electron beams to be irradiated by the electron beam irradiator 21, calibrates the control device by using a resultant value that is analyzed from a detected amount of the secondary electrons, and determines whether the pixel circuit is normal.

Also, the controller 23 controls a driver of the array test device to perform a calibration process and a pixel circuit test process on the array substrate.

In case of need, the calibration process that is performed before the pixel circuit is actually checked can be performed on not all the pixel circuits but on selected pixel circuits only.

The signal analyzer 25 receives the secondary electrons that are output through the contact hole 101 via the electron detecting source 30 after irradiation of first and second electron beams. The signal analyzer 25 uses the detected secondary electrons to calculate a corresponding voltage. That is, the charged voltage of the capacitor can be calculated by using the detected secondary electrons after irradiation of the first electron beams. Also, the anode voltage of the pixel circuit can be calculated by using the detected secondary electrons after second irradiation of the electron beams.

The measured voltage calculated by the signal analyzer 25 is transmitted to the controller 23, and the controller 23 may use the measured voltage to control precision of the control device and/or determine the state of the driving transistor malfunctioning in the pixel circuit.

Gradations can be controlled by using the calibrator 27 for the precision of the control device so as to minimize the noise that may be generated by non-uniformity of a gap between the array test device and the array substrate. That is, when the signal analyzer 25 calculates the measured voltage by using the secondary electrons that are acquired after the irradiation of the first electron beams, the controller 23 compares an expected charged voltage of the capacitor and the measured voltage from the applied voltage of a predetermined signal line. Further, the controller 23 may perform a calibration process by using the calibrator 27 when the voltages are not equivalent according to a comparison result.

The calibrator 27 represents a means for controlling precision of a display means for displaying gradations of the detected voltage on the irradiation of electron beams so as to determine problematic states of the pixels during the actual pixel array test process of the control device. The display means is not restricted, and it includes various kinds of analog and digital display means.

When the voltage measured by the controller 23 for the first time is not equivalent to the charged voltage of the capacitor, the calibrator 27 repeatedly irradiates the electron beams and calculates the measured voltage and performs calibration in order to accurately match the firstly measured voltage and the charged voltage. The firstly measured voltage and the charged voltage of the capacitor are determined to correspond when their difference is provided within a predetermined threshold range, and they are determined to not correspond when the difference is out of the predetermined threshold range.

When the precision of the control device is set through the calibration process, the controller 23 can be driven so that the electron beams may be secondarily irradiated to the anode of the pixel for the array test.

After the secondary irradiation of the electron beam to the pixel array substrate, the controller 23 may determine a pixel as having a malfunctioning driving transistor by using measured voltage information detected by the signal analyzer 25. That is, when the anode voltage of the pixel detected from the secondary electrons is different from the calculated voltage of the irradiation amount that is set before the electron beams are irradiated, the corresponding pixel can be found by referring to position information (an address of the detected pixel unit). When the anode voltage of the corresponding pixel is different from the calculated voltage, it means that the driving transistor is not normally driven or has generated a leakage current so it can be determined as inferior. A process for repairing the troubled part of the corresponding pixel circuit on the array substrate is then performed.

The array test device can minimize damage to the substrate since the anode that may be easily damaged on the pixel array substrate is not used but the charged voltage of the capacitor is measured to calibrate the precision of the control device 2. The calibration process may be performed to remove the noise that may be generated by a fine distance difference between the array test device and the array substrate so the detection performance on the pixel circuit tested in situ can be substantially increased.

Figure 4:
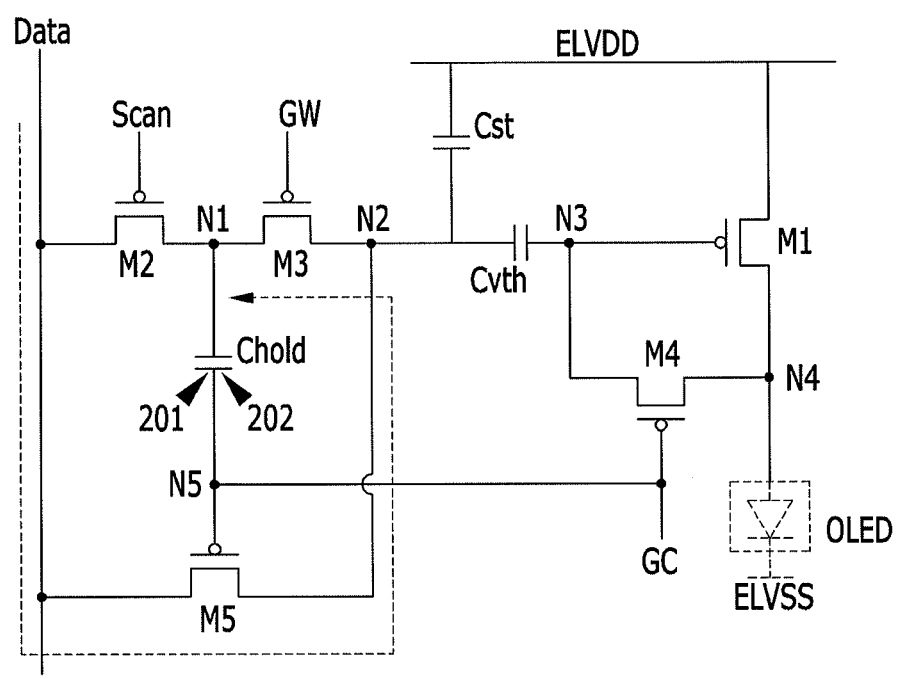
FIG. 4 and FIG. 5 illustrate how equivalent circuits of a pixel of an organic light emitting diode display to which an array test device and a method thereof according to an exemplary embodiment may be applicable.
Figure 5:
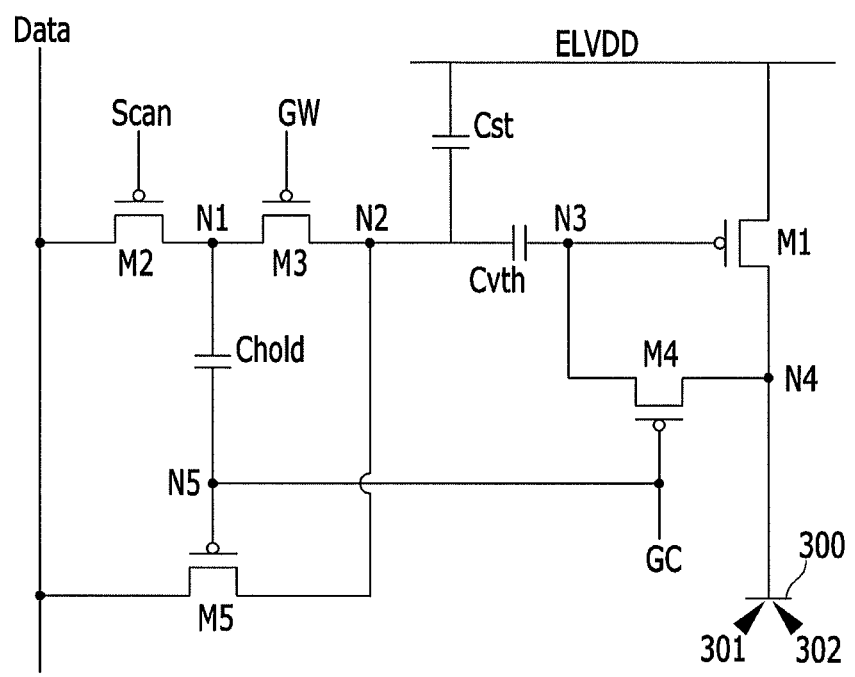

FIG. 4 and FIG. 5 show equivalent circuits of a pixel of an organic light emitting diode display to which an array test device and a method thereof according to an exemplary embodiment are applicable.

The pixel shown in FIG. 4 and FIG. 5 includes a pixel circuit including an organic light emitting diode (OLED), five transistors, and three capacitors.

FIG. 4 shows a position where the electron beams are firstly irradiated in the calibration process for setting precision of the array test device, and FIG. 5 shows a position where the electron beams are secondarily irradiated in the process for testing a normal operation state of the pixel circuit during the array test process. Therefore, the pixel circuit will be described with main reference to FIG. 4, and no repeated portion on the circuit except irradiation of electron beams will be provided for FIG. 5.

In the circuit of FIG. 4, a gate electrode of a driving transistor M1 is connected to a third node N3, a source electrode is connected to a first power source voltage (ELVDD), and a drain electrode is connected to a fourth node N4. The drain electrode of the driving transistor M1 will be connected to a second power source voltage (ELVSS) through an organic light emitting diode (OLED) connected in common to the fourth node N4 after the cell process, and the organic light emitting diode (OLED) is not yet formed in the stage for setting (calibrating) the current precision of the array test stage.

A gate electrode of a switching transistor M2 is connected to a scan line (Scan) for transmitting a scan signal, a source electrode is connected to a data line (Data) for transmitting a data signal, and a drain electrode is connected to a first node N1. A gate electrode of the first control transistor M3 is connected to a first control line (GW) for transmitting a first control signal, a source electrode is connected to the first node N1, and a drain electrode is connected to the second node N2.

A gate electrode of a compensation transistor M4 is connected to a second control line (GC) for transmitting a second control signal for controlling threshold voltage compensation of the driving transistor M1, a source electrode is connected to the fourth node N4, and a drain electrode is connected to the third node N3 to which the gate electrode of the driving transistor M1 is connected.

A gate electrode of a second control transistor M5 is connected to a fifth node N5 and is connected to a second control line (GC) for transmitting the second control signal. A source electrode of the second control transistor M5 is connected to the data line (Data) for transmitting the data signal, and a drain electrode is connected to the second node N2.

A first electrode of a first capacitor Cst is connected to a first electrode of a second capacitor (Cvth) and the drain electrode of the first control transistor M3 at a second node N2, and a second electrode is connected to a first power source voltage (ELVDD) for supplying a driving current to the organic light emitting diode (OLED). The first capacitor Cst stores the data signal applied to the gate electrode of the driving transistor M1.

A first electrode of a second capacitor (Cvth) is connected to the first electrode of the first capacitor Cst and the drain electrode of the first control transistor M3 at the second node N2, and a second electrode is connected to the gate electrode of the driving transistor M1 and the drain electrode of the compensation transistor M4 at the third node N3. The second capacitor (Cvth) stores a compensation voltage for compensating a threshold voltage of the driving transistor M1.

A first electrode of a third capacitor (Chold) is connected to the gate electrode of the second control transistor M5 at the fifth node N5, and a second electrode is connected to the drain electrode of the switching transistor M2 and the source electrode of the first control transistor M3 at the first node N1.

Referring to the pixel shown in FIG. 4, the data signal can be applied to the gate electrode of the driving transistor M1 through two paths. The first path represents a path passing through the switching transistor M2 and the first control transistor M3 from the data line (Data). The second path represents a path for passing through the second control transistor M5 from the data line (Data). The third capacitor (Chold) maintains the voltage at the gate electrode of the second control transistor M5 so as to transmit the data signal to the gate electrode of the driving transistor M1 through the second path.

As shown in FIG. 4, the driving transistor M1, the switching transistor M2, the first control transistor M3, the compensation transistor M4, and the second control transistor M5 can be p-channel field effect transistors. Thin film transistors (TFTs) can be exemplarily used for the field effect transistors. However, the channel type of the transistors (M1-M5) shown in FIG. 4 can be changed to the n-channel, and waveforms of signals for driving them in this case can be inverted.

In the array test according to the exemplary embodiment, first electron beams can be irradiated to the first electrode of the third capacitor (Chold) of FIG. 4 so as to control precision of the control device of the array test device before an array test for the pixel circuit. As another exemplary embodiment, first electron beams can be irradiated to the first electrodes of the first capacitor Cst and the second capacitor (Cvth).

When the electron beam 201 is irradiated to the first electrode of the third capacitor (Chold) as shown in the exemplary embodiment of FIG. 4, secondary electrons 202 are output and are detected to calibrate the control device of the array test device. A charged voltage of the third capacitor (Chold) corresponds to a voltage difference between first electrode and the second electrode, so when one of the second control transistor M5 connected to the first electrode and the switching transistor M2 and the second control transistor M3 connected to the second electrode is not normally functioning or a leakage current is generated, the charged voltage of the third capacitor (Chold) has a value that is different from the initially input voltage. In this instance, the initially input voltage represents an expected reference voltage that must be stored corresponding to a voltage difference at the third capacitor (Chold) when a predetermined voltage is applied to the signal lines.

For example, voltages applied to some signal lines of the pixel circuit of FIG. 4, that is, the first control line (GW), the second control line (GC), and the data line (Data), are set to be about −5V, about −5V, and about 10V, respectively.

The first control transistor M3 is turned on by the voltage applied to the first control line (GW), and the second control transistor M5 is turned on by the voltage applied to the second control line (GC). Therefore, about 10V is supplied to the first node N1 connected to the second electrode of the third capacitor (Chold) through the data line (Data) along a dotted line. Further, about −5V is applied to the fifth node N5 connected to the first electrode of the third capacitor (Chold) by the voltage applied to the second control line (GC).

Then, the expected reference voltage of the third capacitor (Chold) can be calculated to be about 15V.

The expected reference voltage of the capacitor to which the electron beams are irradiated through the voltages applied to the signal lines and the pixel circuit is calculated, and the electron beams are irradiated to the capacitor to determine whether the detected measured voltage is erroneous with respect to the expected reference voltage.

When an error is found, the control device of the array test device is calibrated to remove the error, and the array test device is reset to detect the expected reference voltage.

When the array test device is reset, it is variable by the configuration of the pixel circuit to set the applied voltage according to the signal line and calculate the expected reference voltage of the capacitor.

All pixels receive a constant voltage from the signal lines connected to the capacitor and the voltage is maintained by the capacitor, and therefore, regarding the pixel array configuration, the detected voltage caused by the secondary electrons of electron beams is constant for all pixels, the electron beams which are irradiated to a partially exposed portion of the first electrode of the capacitor. Thus, it may not be needed to irradiate electron beams to all pixels for the purpose of presetting the array test device, and an accurate array test device may be provided irrespective of dispersion caused by material characteristics of all pixels or the manufacturing process.

When the measured error of the array test device is compensated, the actual pixel circuit is tested as shown in FIG. 5. Referring to FIG. 5, the pixel circuit of the pixel array substrate to be tested shows a configuration in which an anode 300 is formed on the fourth node N4 connected to the drain electrode of the driving transistor M1.

As shown in FIG. 5, electron beams 301 are secondarily irradiated to the anode 300 connected to the fourth node N4. The secondary irradiation of electron beams of FIG. 5 is performed for all pixel circuits included in the array substrate since it tests bad pixels of the array substrate. The electrons are injected to the anode of each pixel included in the pixel array through irradiation of electron beams, so when a driving transistor M1 of a pixel in the pixel array is not normally operated, an output voltage of the secondary electrons 302 output by the anode of the corresponding pixel has a value that is different from normal pixels.

The precision of the array test device is reset as shown in FIG. 4, so the detected voltage value of secondary electrons of the normal pixels can be accurately compared with the detected voltage value of secondary electrons of the abnormal pixels during the test process of FIG. 5. Through the comparison, the pixel having the driving transistor M1 that is abnormally driven or generates a leakage current can be easily detected.

Figure 6:
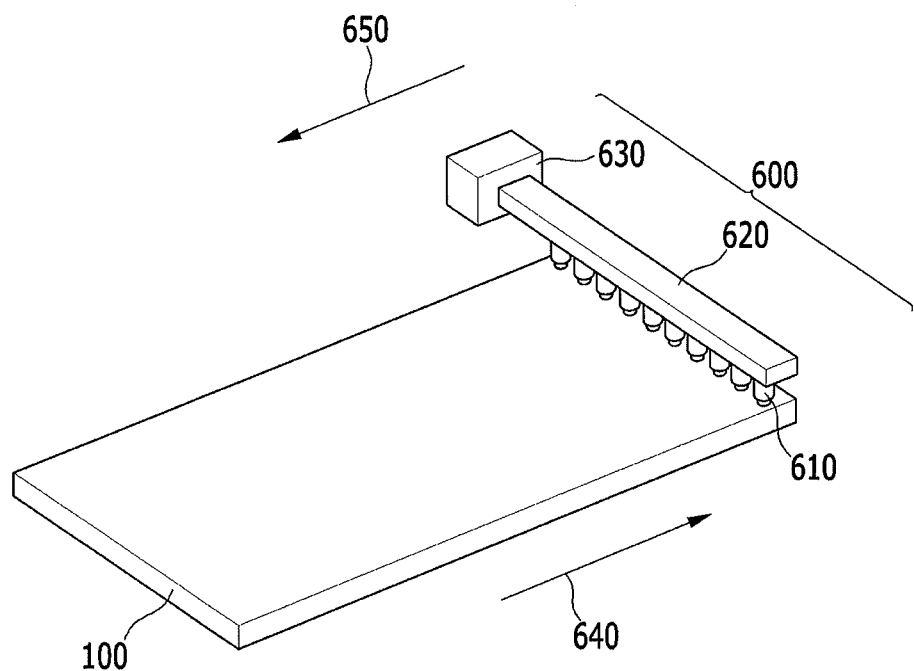
FIG. 6 illustrates a schematic diagram of an array test device to which an array test method according to an exemplary embodiment is applied.

A test method using an array test device for testing the pixel circuit of FIG. 5 is shown in FIG. 6.

The array can be quickly tested in a large organic light emitting diode display by using the array test device 600 shown in FIG. 6.

For better understanding and ease of description, the array test device 600 shown in FIG. 6 shows not all constituent elements but some of them. Referring to FIG. 6, the array test device 600 includes a plurality of micro-columns 610 that include an electron beam emitting source (29 in FIG. 3) and an electron detecting source (30 in FIG. 3) and that are arranged in series and are fixed to a fixing shaft 620. The fixing shaft 620 is moved in a first direction 650 by a driver 630, and the electron beams are irradiated to a line to simultaneously check a plurality of pixel circuits on one line. Multiple fixing shafts 620 on which the micro-columns 610 are arranged in series can improve the test speed. Also, the test can be performed while the array substrate 100 at which the array process is finished is moved in a second direction 640 instead of movement of the fixing shaft 620.

When the in-situ array test (S2 of FIG. 1) described with reference to FIG. 5 and FIG. 6 is finished, products determined to be normal products are transferred to a subsequent panel (cell) process (S3 of FIG. 1). Further, products determined to be inferior products are moved to the repair process (S21 of FIG. 1) and are then transferred to the panel (cell) process (S3 of FIG. 1). In the repair process (S21 of FIG. 1), the array test device 600 shown in FIG. 6 can be applied according to the in-situ method.

According to the exemplary embodiment, operational problems of the transistors are tested through the calibration process of the array test device and the array test process before the panel (cell) process so problems of the pixel array are repaired in advance to increase the yield.

Figure 7:
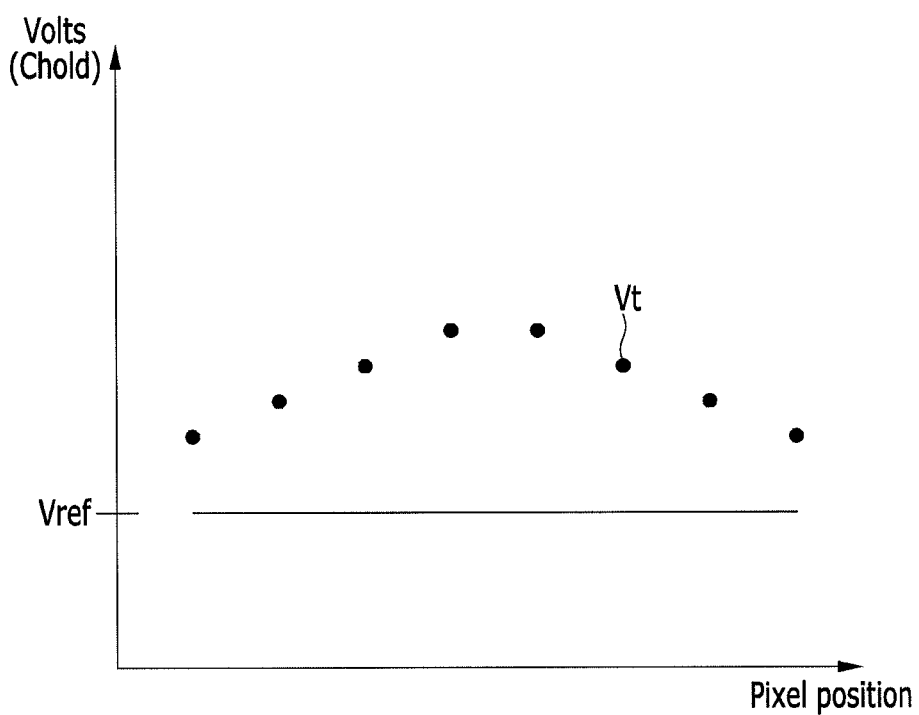
FIGS. 7 to 9 illustrate graphs of voltage distributions for respective pixels according to array testing methods, based on exemplary embodiments.
Figure 8:
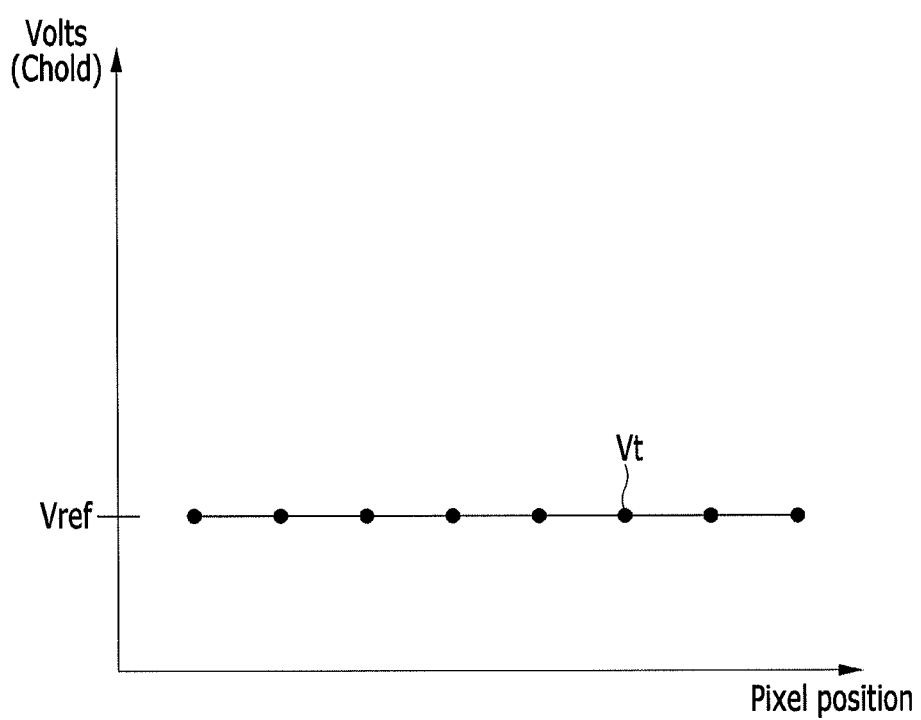
Figure 9:
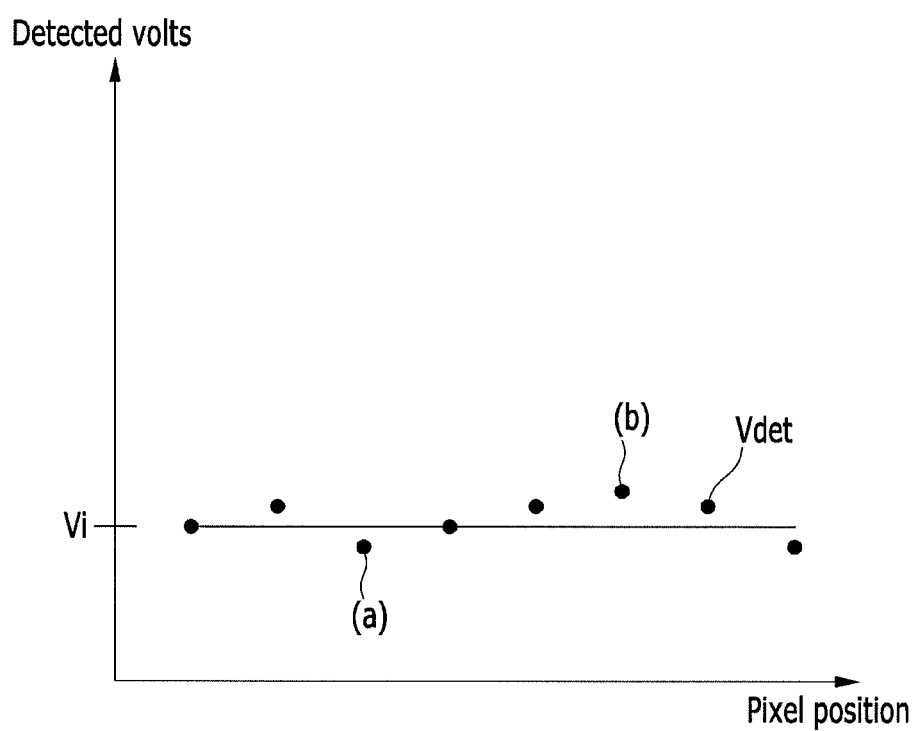

FIG. 7 to FIG. 9 show graphs of voltage distributions for respective pixels according to an array test method according to an exemplary embodiment.

In detail, FIG. 7 shows an expected reference voltage value (Vref) stored by a predetermined applied voltage of a signal line to a capacitor (Chold of FIG. 4) of the corresponding pixel according to a pixel position and a detected voltage value (Vt) measured by firstly irradiating electron beams to the capacitor. Referring to FIG. 7, an error is detected from the detected voltage value (Vt) of the capacitor according to the measured pixel before precision of the array test device is reset, and indication of the detected voltage value is exemplary. Therefore, the detected voltage value of the capacitors of the pixels included in an area sharing the signal line on the pixel array substrate can have the same measured error.

FIG. 8 shows that the detected voltage value (Vt) of secondary electrons of the capacitor is set with an expected reference voltage value (Vref) through calibration of the array test device when it has a measured error as shown in FIG. 7.

FIG. 9 shows a graph for performing an array test process of a pixel by using a precise array test device that is reset through the calibration process of FIG. 8. That is, FIG. 9 shows an input voltage (Vi) that is applied to a pixel through secondary irradiation of electron beams and a detected voltage (Vdet) of the output secondary electrons.

Desirably, the detected voltage of secondary electrons output by normal pixels of the array substrate corresponds to an input voltage, which is a predetermined reference voltage. However, when the detected voltage is included in a predetermined threshold range with reference to the input voltage, it can be determined to be a normal pixel.

However, as shown in (a) and (b) in FIG. 9, the pixels having a detected voltage that is greater than the normal threshold range of the input voltage are determined to have a malfunctioning driving transistor, so they undergo a repair process or are determined to be inferior products.

By way of summation and review, in an organic light emitting diode display, transmission of a driving current of the organic light emitting diode may be controlled by a transistor included in each of a plurality of pixel circuits. If the transistor of the pixel circuit is abnormally operated, or a wire is disconnected or short-circuited, a predetermined driving current may not be applied to the organic light emitting diode. Accordingly, it is advantageous to check the normal operation of the transistors, e.g., driving transistors, included in the pixel circuits, e.g., to repair defects or to not progress to completion of forming the organic light emitting diode display when it is determined that the defects cannot be repaired in terms of manufacturing time and cost.

However, when the operation states of the transistors in the pixel circuits are tested using an electron beam (E-beam) irradiation method, the testing process may cause damage to the pixel circuits (e.g., the irradiated electron beams may cause damage). Further, the distance between a module of a test device and a glass substrate may be different and non-uniform for each pixel so that a corresponding noise component may be generated. Therefore, a measured voltage dispersion of the pixel included in the array substrate may be increased by a damaged state of the pixel circuit and the noise component may, e.g., substantially deteriorate precision, accuracy, and/or reliability of the testing device that uses the electron beams. Accordingly, improved methods for testing the performance of transistors on the pixel array are being sought.

Embodiments relate to a testing device, a method for testing a display device, and a method for manufacturing the display device. For example, embodiments relate to a test device, a method for testing a pixel array of an organic light emitting diode display, and a method for manufacturing an organic light emitting diode display.

In particular, embodiments relate to providing a method for manufacturing an organic light emitting diode display with quality and reliability by using a pixel array test device and method. Embodiments relate to providing the array test device and a method of an organic light emitting diode display for measuring an accurate operational state of a transistor of a pixel within the organic light emitting diode display. Further, embodiments relate to providing the array test device and a method for accurately measuring a transistor for pixels by minimizing damage and noise of a pixel circuit and reducing measured voltage dispersion of the pixel.

Further, according to embodiments, production yield may be increased by accurately determining an operational problem of the transistor through a pixel array test before a panel cell process and preemptively repairing the problem of the pixel array. According to embodiments, damage and noise generated in the pixel circuit may be minimized and the pixel measured voltage dispersion may be reduced to uniformly and accurately measure generation of problems on the respective pixels irrespective of a precise gap difference between the modulator of the test device and the substrate. Also, precision of the array test device of the pixels may be increased to provide an organic light emitting diode display with excellent quality and reliability.

Example embodiments have been disclosed herein, and although specific terms are employed, they are used and are to be interpreted in a generic and descriptive sense only and not for purpose of limitation, and the scope of the present invention described in the claims is not limited thereto. Therefore, those skilled in the art will understand that various modifications and equivalent embodiments are possible. Accordingly, it will be understood by those of skill in the art that various changes in form and details may be made without departing from the spirit and scope of the present invention as set forth in the following claims.

In addition, some of the components described in the specification may be omitted without deterioration of the performance or added in order to improve performance by those skilled in the art. Moreover, the sequence of the steps of the method described in the specification may be changed depending on a process environment or equipment by those skilled in the art. Accordingly, the scope of the present invention should not be determined by the above-mentioned exemplary embodiments but by the appended claims and the equivalents thereto.

What is claimed is:

1. A device for testing an array of an organic light emitting diode display, the device comprising:
   an electron beam irradiator that irradiates first electron beams to a capacitor of a selected pixel from a pixel array, which pixel array includes a plurality of pixels that each include an anode, a driving transistor that transmits a driving current that corresponds to a data signal of an organic light emitting diode according to a scan signal, and at least one capacitor, and that irradiates second electron beams to respective anodes of the plurality of pixels;
   a signal analyzer that detects a first output amount of secondary electrons that are output corresponding to the irradiation of the first electron beams, that detects a second output amount of secondary electrons that are output corresponding to the irradiation of the second electron beams, and that calculates a first detected voltage that corresponds to the first output amount and a second detected voltage that corresponds to the second output amount;

a controller that sets a charging voltage charged into the capacitor, that sets an irradiation amount of the first electron beams, and an irradiation amount of the second electron beams, that compares the first detected voltage and the charging voltage, and that determines an operational state of the pixel array based on the second detected voltage; and a calibrator that performs a calibration process when the first detected voltage and the charging voltage are determined to digress from a predetermined threshold range and are in a non-corresponding relationship with respect to each other.

2. The device as claimed in claim 1, further comprising:

an electron beam output means for irradiating the first electron beams and the second electron beams, an electron detecting means for detecting the secondary electrons that are output corresponding to the irradiation of the first electron beams and to the irradiation of the second electron beams, and a driver driven with a gap from the pixel array.

3. The device as claimed in claim 1, wherein the controller presets a voltage supplied to at least one signal line for connecting the plurality of pixels and sets the charging voltage of the capacitor to be a predetermined reference voltage.

4. The device as claimed in claim 1, wherein:

the controller compares the second detected voltage and an input voltage applied to the anode of each of the plurality of pixels during the irradiation of the second electron beams, and the controller tracks an address of a pixel circuit digressing from a predetermined threshold range to determine a pixel corresponding to the pixel circuit digressing from the predetermined threshold range to be an abnormal pixel.

5. The device as claimed in claim 1, wherein the at least one capacitor of the each pixel is one of a plurality of capacitors, and the pixel further includes:

a first transistor that transmits the data signal to a gate electrode of the driving transistor according to the scan signal;

a second transistor connected to the gate electrode and a drain electrode of the driving transistor, the second transistor compensating a threshold voltage of the driving transistor according to a first control signal;

a third transistor that transmits the data signal to the gate electrode of the driving transistor according to the first control signal;

a first capacitor of the plurality of capacitors that stores a data voltage corresponding to the data signal applied to the gate electrode of the driving transistor;

a second capacitor of the plurality of capacitors that stores a compensating voltage for compensating the threshold voltage of the driving transistor; and a third capacitor of the plurality of capacitors that maintains a gate electrode voltage of the third transistor, the first electron beams being irradiated to one of the first, second, and third capacitors.

6. The device as claimed in claim 5, wherein the pixel further includes a fourth transistor that is connected between a drain electrode of the first transistor and the gate electrode of the driving transistor, and that transmits the data signal transmitted by the first transistor to the gate electrode of the driving transistor according to a second control signal.

\* \* \* \* \*